United States Patent
Pelley et al.

(10) Patent No.: US 10,224,094 B1
(45) Date of Patent: Mar. 5, 2019

(54) RESISTIVE NON-VOLATILE MEMORY AND A METHOD FOR SENSING A MEMORY CELL IN A RESISTIVE NON-VOLATILE MEMORY

(71) Applicant: NXP USA, INC., Austin, TX (US)

(72) Inventors: Perry Pelley, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/880,836

(22) Filed: Jan. 26, 2018

(51) Int. Cl.
*G11C 11/44* (2006.01)
*G11C 11/4096* (2006.01)
*G11C 11/16* (2006.01)
*G11C 7/12* (2006.01)
*G11C 11/4099* (2006.01)
*G11C 7/14* (2006.01)
*G11C 7/06* (2006.01)

(52) U.S. Cl.
CPC .......... *G11C 11/4096* (2013.01); *G11C 7/06* (2013.01); *G11C 7/12* (2013.01); *G11C 7/14* (2013.01); *G11C 11/1673* (2013.01); *G11C 11/4099* (2013.01)

(58) Field of Classification Search
None
See application file for complete search history.

(56) References Cited

U.S. PATENT DOCUMENTS

| | | | |
|---|---|---|---|
| 6,055,178 A | 4/2000 | Naji | |
| 6,212,109 B1 * | 4/2001 | Proebsting | G11C 7/065 257/E21.659 |
| 6,697,294 B1 | 2/2004 | Qi et al. | |
| 8,194,475 B2 | 6/2012 | Taylor et al. | |
| 8,693,273 B2 | 4/2014 | Yuh et al. | |
| 8,917,536 B2 | 12/2014 | Jan et al. | |
| 9,318,195 B1 * | 4/2016 | Ryu | G11C 11/56 |
| 2016/0018454 A1 * | 1/2016 | Jeon | G11C 29/025 324/509 |

OTHER PUBLICATIONS

Koike, Hiroki, et al.; "1T1MTJ STT-MRAM Cell Array Design with an Adaptive Reference Voltage Generator for Improving Device Variation Tolerance;" 2015 IEEE International Memory Workshop (IMW), May 17-20, 2015; DOI: 10.1109/IMW.2015.7150264.

(Continued)

*Primary Examiner* — Uyen B Tran

(57) ABSTRACT

A semiconductor device includes an array of memory cells, and a reference voltage generation circuit including a first set of reference memory cells coupled to a first bit line, a second set of reference memory cells coupled to a second bit line, a first capacitor having a first terminal coupled to the first bit line, and a second terminal, a second capacitor having a first terminal coupled to the second terminal of the first capacitor at a first node and a second terminal coupled to the second bit line, an amplifier including a first input selectively coupled to the first node and a second input coupled to an output of the amplifier that provides reference voltage used by sense amplifiers, and a third capacitor including a first terminal coupled to the output of the amplifier and a second terminal coupled to a first supply voltage.

20 Claims, 3 Drawing Sheets

(56) References Cited

OTHER PUBLICATIONS

Na, Taehui, et al.; "Multiple-Cell Reference Scheme for Narrow Reference Resistance Distribution in Deep Submicrometer STT-RAM;" IEEE Transactions on Very Large Scale Integration (VLSI) Systems (vol. 24, Issue: 9, Sep. 2016); DOI: 10.1109/TVLSI.2016.2536639.

Takemura, Riichiro, et al.; "A 32-Mb SPRAM With 2T1R Memory Cell, Localized Bi-Directional Write Driver and '1'/'0' Dual-Array Equalized Reference Scheme;" IEEE Journal of SolidSolid-Stale Circuits (vol. 45, Issue: 4, Apr. 2010); DOI: 10.1109/JSSC.2010.2040120.

Xue, Xiaoyong, et al.; "Dynamic Data-Dependent Reference to Improve Sense Margin and Speed of Magnetoresistive Random Access Memory;" IEEE Transactions on Circuits and Systems II: Express Briefs (vol. 64, Issue: 2, Feb. 2017); DOI: 10.1109/TCSII.2016.2554998.

\* cited by examiner

US 10,224,094 B1

RESISTIVE NON-VOLATILE MEMORY AND A METHOD FOR SENSING A MEMORY CELL IN A RESISTIVE NON-VOLATILE MEMORY

BACKGROUND

Field

This disclosure relates generally to resistive non-volatile memories, and more specifically, to sensing a memory cell in a resistive non-volatile memory.

Related Art

Resistive memories are commonly used as non-volatile memories (NVMs). Reading data stored in such memories is accomplished by sensing differences in resistance in a resistive element of a memory cell between two states, a high resistive state (HRS) and a low resistive state (LRS). In order to sense the programmed state of a memory cell, a reference voltage is typically used, in which the bitcell voltage is compared with the reference voltage. In some resistive memories used today, the reference voltage is provided as the average between a single reference bitcell programmed to a first logic state and a single reference bitcell programmed to a second, opposite, logic state. However, in this type of memory, the variation in the reference voltage is generally too great due, for example, to process variations in the reference bitcells. Since the difference in resistance between a high state and a low state can be very small, a great variation in the reference voltage reduces read accuracy. Therefore, a need exists for an improved reference voltage generation for a resistive NVM.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In a resistive memory, a reference voltage (Vref) is generated which accurately tracks with process, voltage, and temperature half way between a bitcell voltage of a logic "1" and a bitcell voltage of a logic "0". This produces an improved reference voltage with less variation, and thus allows for more accurate sensing. In one embodiment, a voltage of a plurality of reference bits programmed to a logic "1" and a plurality of reference bits programmed to "0" is averaged. The programming of these reference bits may be performed at factory, such as during probe. During operation, reference voltage periodic regeneration is used to track power supply voltage and temperature changes. With this periodic regeneration, a precharge phase is followed by a voltage reference regeneration phase, utilizing two capacitors. In the reference voltage regeneration phase, a logic "1" reference voltage (provided by the plurality of reference bits programmed to a "1") is charge shared with a logic "0" reference voltage (provided by the plurality of reference bits programmed to a "0") between the two capacitors. In this manner, a reference voltage half way between the logic "1" reference voltage and logic "0" reference voltage is accurately generated, and improved sensing may be achieved.

Figure 1:
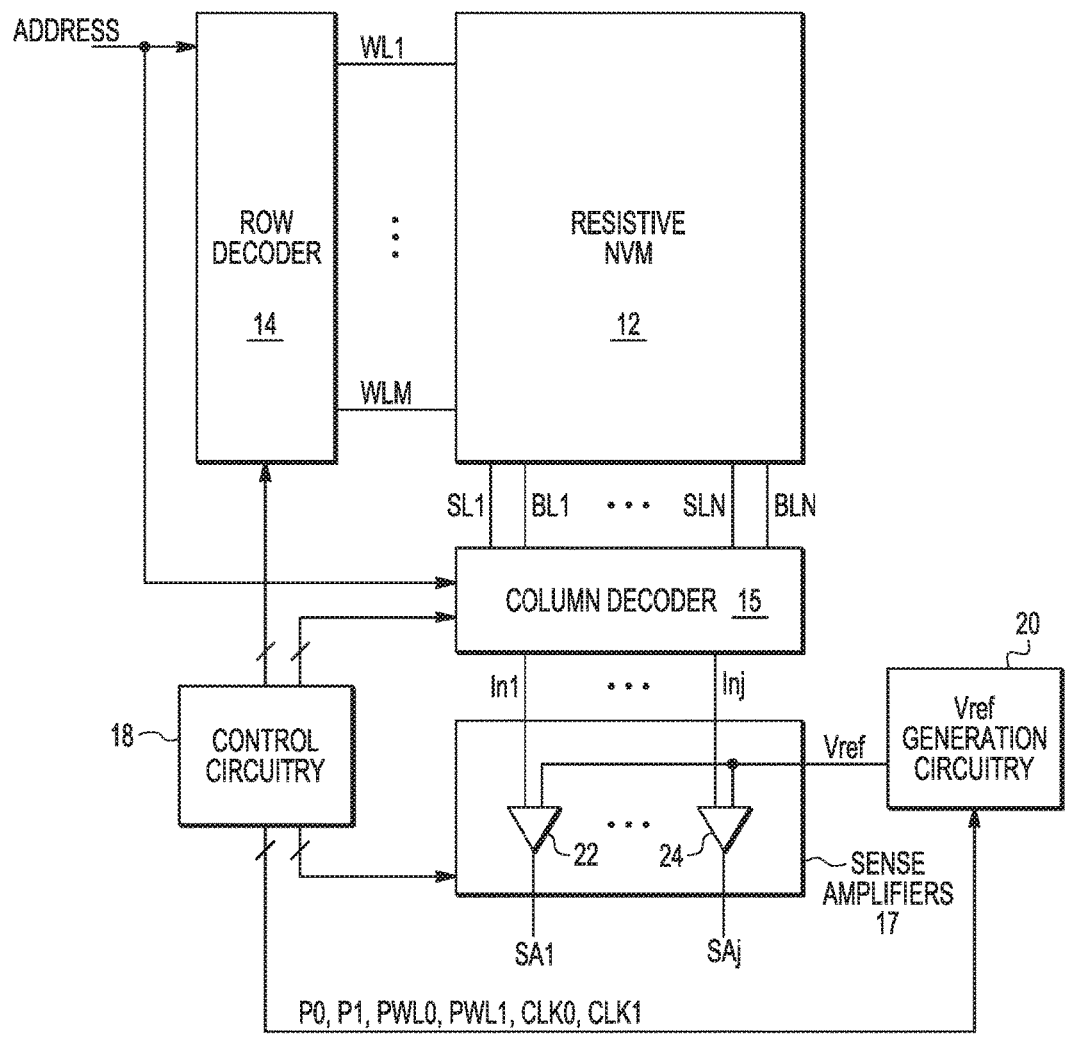
FIG. 1 illustrates, in block diagram form, a memory, including reference voltage generation circuitry, in accordance with one embodiment of the present invention.

FIG. 1 illustrates a memory 10 in accordance with one embodiment of the present invention. Memory 10 is formed in one or more integrated circuits. Memory 10 includes a resistive NVM array 12, a row decoder 14, column decoder 15, sense amplifiers 17, reference voltage (Vref) generation circuitry 20, and control circuitry 18. Array 12 includes M word lines, WL1-WLM, N bit lines, BL1-BLN, and N source lines, SL1-SLN. A bitcell is located at the intersection of each WL and BL, for a total of M×N bitcells in NVM array 12. Row decoder 14 is coupled to the M word lines, and column decoder is coupled to the N bit lines and N source lines. Control circuitry 18 is coupled to row decoder 14, column decoder 15, sense amplifiers 17, and Vref generation circuitry 20. An access address for a read or write access is provided to row decoder 14 and to column decoder 15. In response to a read request, row decoder 14 asserts the selected word line based on a first portion of the access address, and column decoder 15 accesses the selected bit lines and corresponding source lines based on a second portion of the access address, and column decoder 15 outputs j sense amplifier inputs In1-Inj (which are determined by the states of the bitcells at the intersections of the selected word line and selected bit lines). Sense amplifiers 17 includes j sense amplifiers, such as sense amplifier 22 and sense amplifier 24, in which each sense amplifier receives a corresponding sense amplifier input from In1-Inj. Each sense amplifier also receives Vref from Vref generation circuitry 20. In response to a comparison of the corresponding sense amplifier input and Vref, each sense amplifier provides a corresponding sense amplifier output, SA. Therefore, sense amplifiers 17 provide j sense amplifier outputs, SA1-SAj, corresponding to the read data in response to the read request. Control circuitry 18 provides the appropriate control signals, as needed, to row decoder 14 column decoder 15, and sense amplifiers 17 to perform read and write operations, and also provides the appropriate control signals to Vref generation circuitry 20, including P0, P1, PWL0, PWL1, CLK0, and CLK1.

Note that FIG. 1 is not a complete diagram with all elements of memory 10. Only those elements needed to understand the described embodiments are included. For example, data signals and other control signals can be received by memory 10 and other circuitry may be included in addition to the row decoder, column decoder, sense amplifiers, and control circuitry. However, the embodiments described herein relate to generating a voltage reference for read operations of memory 10, therefore, circuitry related to a write operation will not be discussed herein.

Figure 2:
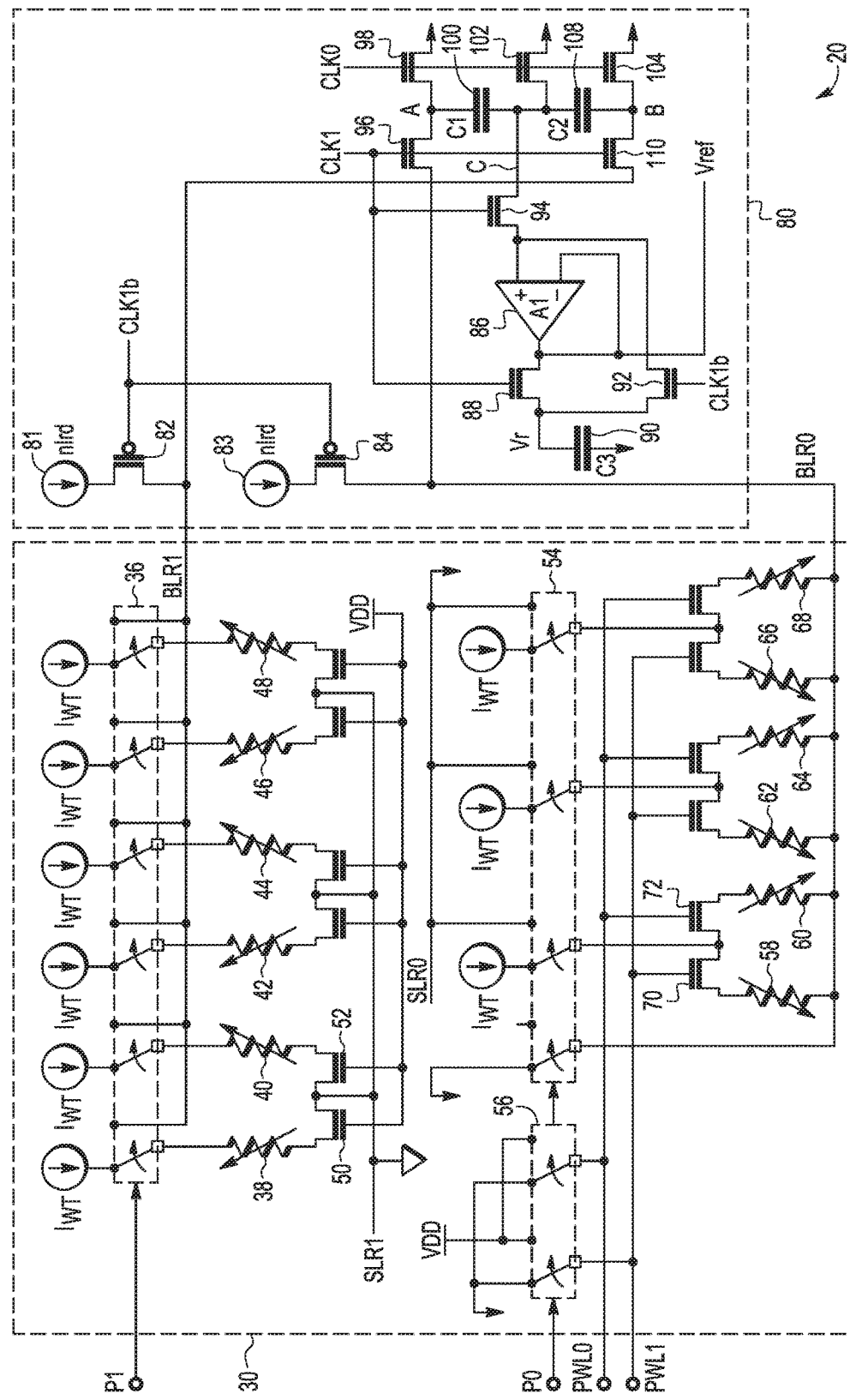
FIG. 2 illustrates, in schematic form, a more detailed view of the reference voltage generation circuitry of FIG. 1, in accordance with one embodiment of the present invention.

FIG. 2 illustrates a more detailed view of Vref generation circuitry 20 which includes a reference bits circuit 30 coupled to a reference calibration circuitry 80, in accordance with one embodiment of the present invention. Reference bits circuit 30 includes a first set of reference memory cells, including resistive memory elements 58, 60, 62, 64, 66, and 68, coupled to a bank of switches 54, and a second set of reference memory cells, including resistive memory elements 38, 40, 42, 44, 46, and 48, coupled to a bank of switches 36. Each reference memory cell in the first set of reference cells includes a first resistive element (e.g. resistive element 58), a second resistive element (e.g. resistive element 60), a first access transistor (e.g. access transistor 70), and a second access transistor (e.g. access transistor 72), in which first terminals of the first and second resistive elements are coupled to a first bit line BLR0, a second terminal of the first resistive element is coupled to a first current electrode of the first access transistor, a second current electrode of the first access transistor is coupled to a first current electrode of the second access transistor, and a second current electrode of the second access transistor is coupled to a second terminal of the second resistive element. An access node at the second current electrode of the first access transistor and at the first current electrode of the second access transistor is coupled to bank of switches 54. A control electrode of the second access transistors of the reference memory cells (e.g. control electrode of access transistor 72) is coupled to a first control word line, PWL0. A control electrode of the first access transistors of the reference memory cells (e.g. control electrode of access transistor 70) is coupled to a second control word line, PWL1. The access nodes between the first and second access transistors are coupled to corresponding switches of bank of switches 54, in which each switch couples the access node to a current source, Iwt, or a source line, SLR0, depending on a control signal P0. Switches 56 selectively couple PWL0 to a first voltage supply terminal (e.g. VDD) or a second voltage supply terminal (e.g. ground) and selectively couple PWL1 to the first voltage supply terminal or the second supply terminal, also based on P0.

Each reference memory cell in the second set of reference cells includes a first resistive element (e.g. resistive element 38), a second resistive element (e.g. resistive element 40), a first access transistor (e.g. access transistor 50), and a second access transistor (e.g. access transistor 52), in which first terminals of the first and second resistive elements are coupled to bank of switches 36, a second terminal of the first resistive element is coupled to a first current electrode of the first access transistor, a second current electrode of the first access transistor is coupled to a first terminal of the second access transistor, and the second current electrode of the second access transistor is coupled to a second terminal of the second resistive element. An access node at the second current electrode of the first access transistor and the first current electrode of the second access transistor is coupled to a source line, SLR1, which is coupled to a second voltage supply terminal (e.g. ground). Bank of switches 36 includes a switch coupled to the first terminal of each resistive memory element which couples the first terminal of each resistive memory element to one of a current source Iwt or a second bit line, BLR1, based on a control signal P1.

Each resistive element is configured to store one bit of data, either a logic level high ("1") or a logic level zero ("0"). Reference cell circuit 30 is configured to program the resistive elements in the first set of resistive elements, including resistive elements 58, 60, 62, 64, 66, and 68, to a "0" (i.e. to store data 0), and the resistive elements in the second set of resistive elements, including resistive elements 38, 40, 42, 44, 46, and 48, to a logic "1" (i.e. to store data 1). In the illustrated embodiment, each of the first and second set of resistive elements includes n resistive elements, in which n=6. However, in different embodiments n can have a different value. In one embodiment, each reference memory cell is described as having two resistive elements, each capable of storing one bit. In this manner, the access node between the two access transistors can be shared and coupled to bank 54 or SLR1, as described above. However, each resistive element can also be referred to as a memory cell.

In operation, the programming of the resistive elements of the memory cells can be programmed in the factory, prior to being used in the field. In one embodiment, to program a "1" to the second set of resistive elements in a first program mode, P1 is negated (set to "0") such that bank of switches 36 couples the first terminal of each resistive element to a corresponding current source Iwt. During the first program mode, P0 is negated, SLR1 is coupled to ground, and the control electrodes of the access transistors, which are NMOS transistors, are coupled to VDD. In this manner, a programming current is provided down through each resistive element to ground, thus programming them to a "1". Therefore, after this programming, there are n "1" bits in reference cell circuit 30. P1 is then asserted such that bank of switches 36 couples the first terminal of each resistive element to BLR1.

Continuing with reference cell circuit 30, in one embodiment, to program a "0" to the first set of resistive elements in a second program mode, P0 is negated such that bank of switches 54 couples each access node between the access transistors to a corresponding current source Iwt and couples BLR0 to ground. During the second program mode, P1 is asserted. Switches 56 couple PWL0 to VDD while PWL1 is coupled to ground for a first time period in the second program mode such that a programming current is provided through the second resistive element of each memory cell, through the second access transistor which is turned on by PWL0, thus programming them to a "0". Switches 56 then couple PWL1 to VDD while PWL0 is coupled to ground for a second time period in the second program mode such that a programming current is provided through the first resistive element of each memory cell, through the first access transistor which is turned on by PWL1, thus programming them to a "0". Therefore, after this programming, there are n "0" bits in reference cell circuit 30. P0 is then asserted such that bank of switches 54 couples the access nodes to SLR0, which is coupled to ground, and decouples BLR0 from ground. Note that the programming of the memory cells in reference cell circuit 30 can be done in the reverse order in which the first set of resistive elements is programmed to "0" followed by the second set of resistive elements being programmed to "1".

In one embodiment, P0, P1, PWL0, and PWL1 are probe pads in which these probe pads are used to program all the reference resistive elements. In this manner, programming of the reference resistive elements can be done at probe in the factory.

Still referring to FIG. 2, reference calibration circuitry 80 includes p-type transistors 82 and 84, and n-type transistors 88, 94, 92, 96, 98, 102, 104, and 110 (each also referred to as a switch), amplifier 86, and capacitors C3 90, C1 100, and C2 108. Two clock signals, CLK0 and CLK1 are provided to circuitry 80, as well as the inverses of the clock signals, CLK0b and CLK1b, respectively. A first current electrode of transistor 82 is coupled to a current source 81, a control electrode of transistor 82 is coupled to receive CLK1b, and a second current electrode of transistor 82 is coupled to BLR1. Current source 81 provides a read current nIrd that is proportional to n, i.e. the number of parallel resistive memory elements in circuit 30 programmed to "1". A first current electrode of transistor 84 is coupled to a current source 83, a control electrode of transistor 84 is coupled to receive CLK1b, and a second current electrode of transistor 84 is coupled to BLR0. Current source 83 provides a read current nIrd that is proportional to n, i.e. the number of parallel resistive memory elements in circuit 30 programmed to "0". Note that in the illustrated embodiment, the same value of n is used for the number of resistive memory elements programmed to "1" and the number of resistive memory elements programmed to "0". That is, the first set of resistive elements include the same number of resistive elements as the second set of resistive elements.

Transistor 96 includes a first current electrode coupled to BLR0 and a second current electrode coupled to a circuit node A. Transistor 98 has a first current electrode coupled to node A and a second current electrode coupled to ground. Transistor 110 has a first current electrode coupled to BLR1 and a second current electrode coupled to a circuit node B. Transistor 104 has a first current electrode coupled to node B and a second current electrode coupled to ground. Transistor 102 has a first current electrode coupled to a circuit node C and a second current electrode coupled to ground. Capacitor C1 100 (referred to as C1) has a first terminal coupled to node A and a second terminals coupled to node C, and capacitor C2 108 (referred to as C2) has a first terminal coupled to node C and a second terminal coupled to node B. Transistor 88 has a first current electrode coupled to a first terminal of capacitor C3 90 (referred to as C3) and a second current electrode coupled to an output of amplifier 86. A second terminal of C3 is coupled to ground. Transistor 94 has a first current electrode coupled to a non-inverting input of amplifier 86 and a second current electrode coupled to node C. Transistor 92 has a first current electrode coupled to the first current electrode of transistor 88 and a second current electrode coupled to the first current electrode of transistor 94. Vref is provided to the non-inverting input of amplifier 86, and the inverting input of amplifier 86 is coupled to the output of amplifier 86. Control electrodes of transistors 88, 94, 96, and 110 are each coupled to receive CLK1. Control electrodes of transistors 98, 102, and 104 are each coupled to receive CLK0. A control electrode of transistor 92 is coupled to receive CLK1*b*. The first terminal of C3 provides a voltage Vr. Note that amplifier 86 is an offset calibrated amplifier.

Figure 3:
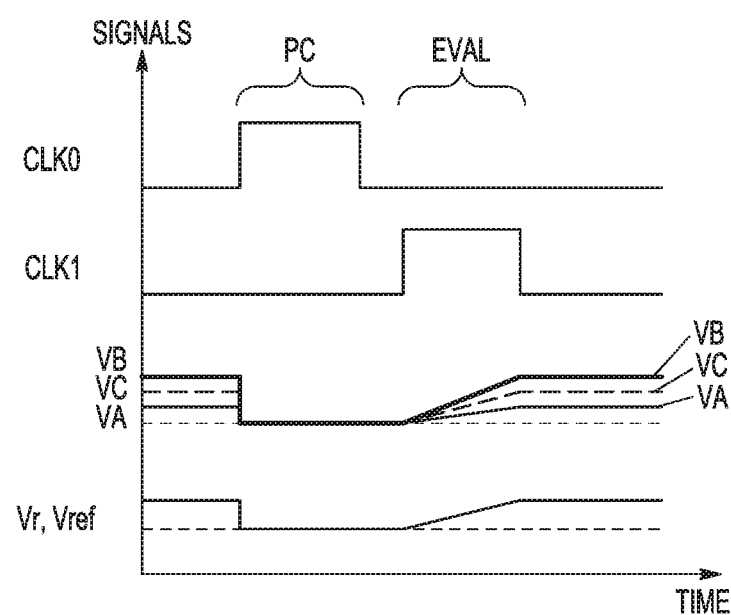
FIG. 3 illustrates, in timing diagram form, various signals in the reference voltage generation circuitry of FIG. 2, in accordance with one embodiment of the present invention.

Operation of reference calibration circuitry 80, using reference cell circuit 30, will be discussed in reference to the timing diagram of FIG. 3. Reference calibration circuitry 80 regenerates Vref periodically, which tracks power supply voltage and temperature changes. The regeneration of Vref is done when no reads to resistive RAM 12 are being performed, and how often the periodic regeneration is performed can depend on the requirements of the system. Note that transistors 82 and 84 are only turned on when needed to regenerate Vref by CLK1*b* being low, and otherwise turned off by turning off transistors 82 and 84 with CLK1*b* being high. Except when programming the reference resistive elements or regenerating the reference (to be described below), the bit lines of reference cell circuit 30 discharge to ground through the resistive elements.

The generation of the reference voltage Vref includes a precharge (PC) phase and an evaluation (eval) phase. Referring to FIGS. 2 and 3, first, a precharge is performed. As seen in FIG. 3, for the PC phase, CLK0 goes high (turning on transistors 98, 102, and 104) to precharge C1 and C2 to ground. Afterwards, CLK0 goes back to low, turning off transistors 98, 102, and 104, leaving the second terminals of C1 and C2 floating.

After completion of the PC phase, the evaluate (eval) phase begins. During evaluation, CLK1*b* (complement of CLK1 shown in FIG. 3) goes low turning on transistors 82 and 84 which couple the two read current sources 81 and 83 to BLR1 and BLR0, respectively, each providing nlrd to the two arrays of reference bits. At this point, the second set of programmed resistive elements is coupled to SLR0 (which is coupled to ground) by bank of switches 54, and the first set of programmed resistive elements is coupled to BLR1 by bank of switches 36. The access transistors corresponding to the second set of programmed resistive elements and the access transistors corresponding to the first set of programmed resistive elements are turned on by coupling their control electrodes to VDD. Therefore, the current provided by current source 81 is provided through each of the first set of programmed resistive elements from BLR0 down to SLR0 (which is coupled to ground), and the current provided by current source 83 is provided through each of the second set of programmed resistive elements from BLR1 down to SLR1 (which is also coupled to ground).

Also for the evaluation phase, CLK1 goes high, which is simultaneous with CLK1*b* going low. This turns on transistors 96, 110, 94, and 88. As a result, C1 is coupled to BLR0 at node A, and C2 is coupled to BLR1 at node B. The "1" programmed reference cells, coupled to BLR1, raises the voltage at node B (VB) to the "1" reference voltage, as seen in FIG. 3. The "0" programmed reference cells, coupled to BLR0, raises the voltage at node A (VA) to the "0" reference voltage, as seen in FIG. 3. In response, node C charge shares between C1 and C2 and thus a voltage at node C (VC) is half way between VA and VB. Also, during the evaluation phase while CLK1 is high and transistors 88 and 94 are turned on, amplifier 86 charges C3 to a voltage, VR, in which VR=VC. At the end of the evaluation phase, CLK1 goes low again and remains low until a next evaluation phase for regenerating Vref.

The evaluation phase is followed by a buffer phase. CLK1 goes low, turning off transistors 88 and 94, and CLK1*b* goes high, turning on transistors 92. Therefore, C3 is decoupled from the output of amplifier 86 and is coupled to the non-inverting input of amplifier 86 in which amplifier 86 now outputs a buffered VR which is provided as Vref.

Therefore, by now it can be understood how an improved reference voltage with less variation can be provided through the use of an average voltage between a plurality of reference bits programmed to "1" and a plurality of reference bits programmed to "0". These reference bits can be programmed at factory, and then, during operation, a periodic regeneration of the reference voltage allows for a reference voltage which successfully tracks with process, voltage, and temperature.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name, an asterix (*) following the name, or a "b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

In one embodiment, the illustrated elements of memory 10 are circuitry located on a single integrated circuit or within a same device. Memory 10 may be included in a larger integrated circuit with other circuitry, such as one or more processors, or may be packaged with in a system-on-chip (SoC) device.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, more or fewer amplification stages may be used in each sense amplifier. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a semiconductor device includes an array of memory cells; a reference voltage generation circuit including: a first set of reference memory cells coupled to a first bit line, a second set of reference memory cells coupled to a second bit line, a first capacitor having a first terminal coupled to the first bit line, and a second terminal, a second capacitor having a first terminal coupled to the second terminal of the first capacitor at a first node and a second terminal coupled to the second bit line, an amplifier including a first input selectively coupled to the first node and a second input coupled to an output of the amplifier, wherein the output of the amplifier is a reference voltage, and a third capacitor including a first terminal coupled to the output of the amplifier and a second terminal coupled to a first supply voltage; and sense amplifier circuitry configured to use the reference voltage to read data stored in the array of memory cells. In one aspect, the semiconductor device further includes a first switch having a first current electrode coupled to the first node and a second current electrode coupled to the first input to the amplifier; a second switch having a first current electrode coupled to the output of the amplifier and a second current electrode coupled to the first terminal of the third capacitor; and a third switch having a first current electrode coupled between the first terminal of the third capacitor and the second current electrode of the second switch, and a second current electrode coupled between the first input to the amplifier and the second current electrode of the first switch, wherein the reference voltage is tapped between the output of the amplifier and the first current electrode of the second switch. In a further aspect, the semiconductor device further includes a fifth switch having a first current electrode coupled to the first bit line and a second current electrode coupled to the first terminal of the first capacitor; a sixth switch having a first current electrode coupled to the second bit line and a second current electrode coupled to the second terminal of the second capacitor. In yet a further aspect, the semiconductor device further includes a seventh switch having a first current electrode coupled to the first terminal of the first capacitor and a second current electrode coupled to the first supply voltage; an eighth switch having a first current electrode coupled to the first node and a second current electrode coupled to the first supply voltage; a ninth switch having a first current electrode coupled to the second terminal of the second capacitor and a second current electrode coupled to the first supply voltage. In another aspect, the first, second, fifth and sixth switches are NMOS transistors that include a control electrode coupled to a first clock signal, the third switch is an NMOS transistor that includes a control electrode coupled to a complement of the first clock signal, and the seventh, eighth, and ninth switches are NMOS transistors that include a control electrode coupled to a complement of a second clock signal. In yet another aspect of the embodiment, each of the first set of reference memory cells includes a first resistive memory element, a second resistive memory element, a first access transistor, and a second access transistor, the first resistive memory element includes a first terminal coupled to the first bit line, and a second terminal coupled to a first current electrode of the first access transistor, the first access transistor includes a second current electrode selectively coupled to a respective current source during a first program mode and to a first source line when not in the first program mode, and a control electrode coupled to a first word line, the second resistive memory element includes a first terminal coupled to the first bit line, and a second terminal coupled to a first current electrode of the second access transistor, and the second access transistor includes a second current electrode selectively coupled to the respective current source during the first program mode and to the first source line when not in the first program mode, and a control electrode coupled to a second word line. In a further aspect, each of the second set of reference memory cells includes a first resistive memory element, a second resistive memory element, a first access transistor, and a second access transistor, wherein the first resistive memory element includes a first terminal selectively coupled to a respective current source during a second program mode and the second bit line when not in the second program mode, and a second terminal coupled to a first current electrode of the first access transistor, the first access transistor includes a second current electrode coupled to a second source line, and a control electrode coupled to a second supply voltage, the second resistive memory element includes a first terminal selectively coupled to a respective current source during the second program mode and the second bit line when not in the second program mode, and a second terminal coupled to a first current electrode of the second access transistor, and the second access transistor includes a second current electrode coupled to the second source line, and a control electrode coupled to the second supply voltage. In yet a further aspect, the first set of reference memory cells are programmed to store a first data value during the second program mode; and the second set of reference memory cells are programmed to store a second data value during the first program mode, wherein the first data value is different than the second data value. In another aspect, the semiconductor device further includes control circuitry configured to: couple the first bit line to the first supply voltage during the first programming mode, and float the first bit line when not in the first programming mode. In another further aspect, the semiconductor device further includes control circuitry configured to: float the first and second word lines in the second programming mode and couple the first and second word lines to a second supply voltage when not in the second programming mode.

In another embodiment a method of generating a reference voltage for a memory device with an array of resistive non-volatile memory (RNVM) cells includes in a reference voltage generation circuit including a first set of reference memory cells coupled to a first bit line and a second set of reference memory cells coupled to a second bit line: charging a first capacitor having a first terminal coupled to the first bit line to a first voltage level, charging a second capacitor to a second voltage level that is different than the first voltage level, the second capacitor having a first terminal coupled to the second terminal of the first capacitor at a first node and a second terminal coupled to the second bit line, and charge sharing between the first and second capacitors to provide a reference voltage, wherein the reference voltage is between the first and second voltage levels; and using the reference voltage to read data stored in the array of RNVM memory cells. In one aspect, the method further includes before charging the first and second capacitors, programming the first set of reference memory cells to store data "0", and programming the second set of reference memory cells to store data "1". In another aspect, the method further includes charging a third capacitor to the reference voltage through a unity gain amplifier.

In yet another embodiment, a memory device includes an array of resistive non-volatile (RNVM) memory cells; sense amplifier circuitry coupled to the array of RNVM memory cells; a reference voltage generator circuit coupled to supply a reference voltage to the sense amplifier circuitry, the reference voltage generator circuit including: a first set of reference memory cells programmed to store data "0", a second set of reference memory cells programmed to store data "1", a first bit line coupled to the first set of reference memory cells and to a first terminal of a first capacitor, a second bit line coupled to the second set of reference memory cells and to a first terminal of a second capacitor, wherein a second terminal of the first capacitor is coupled to a second terminal of the second capacitor at a first node, an amplifier including a first input coupled to the first node and a second input coupled to an output of the amplifier, wherein the reference voltage is provided at the output of the amplifier, and a third capacitor including a first terminal coupled to the output of the amplifier and a second terminal coupled to a first supply voltage. In one aspect, the memory device further includes a first switch configured to couple the first terminal of the first capacitor to the first bit line when a first clock signal is in a first state and to decouple the first capacitor from the first bit line when the first clock signal is in a second state; a second switch configured to couple the first terminal of the second capacitor to the second bit line when a first clock signal is in a first state and to decouple the second capacitor from the second bit line when the first clock signal is in a second state. In a further aspect, the memory device further includes a third switch configured to selectively couple and decouple the first node to the first input to the amplifier; a fourth switch configured to selectively couple and decouple the output of the amplifier to the first terminal of the third capacitor; and a fifth switch configured to selectively couple and decouple the first terminal of the third capacitor to the first input of the amplifier. In yet a further aspect, the memory device further includes a sixth switch configured to selectively couple the first terminal of the first capacitor to the first supply voltage; a seventh switch configured to selectively couple the first node to the first supply voltage; an eighth switch configured to selectively couple to the first terminal of the second capacitor to the first supply voltage. In yet a further aspect, the first, second, third and fourth switches are NMOS transistors that include a control electrode coupled to a first clock signal; the fifth switch is an NMOS transistor that includes a control electrode coupled to a complement of the first clock signal; the sixth, seventh, and eighth switches are NMOS transistors that include a control electrode coupled to a complement of a second clock signal. In yet an even further aspect, the memory device further includes control circuitry configured to: de-assert the first clock signal during a pre-charge mode and assert the first clock signal outside the pre-charge mode, and assert the second clock signal during an evaluate mode and de-assert the second clock signal outside the evaluate mode. In another aspect of the yet another embodiment, the memory device further includes each of the first set of reference memory cells includes a first resistive memory element, a second resistive memory element, a first access transistor, and a second access transistor; and each of the second set of reference memory cells includes a first resistive memory element, a second resistive memory element, a first access transistor, and a second access transistor.

What is claimed is:
1. A semiconductor device comprising:
   an array of memory cells;
   a reference voltage generation circuit including:
      a first set of reference memory cells coupled to a first bit line,
      a second set of reference memory cells coupled to a second bit line,
      a first capacitor having a first terminal coupled to the first bit line, and a second terminal,
      a second capacitor having a first terminal coupled to the second terminal of the first capacitor at a first node and a second terminal coupled to the second bit line,
      an amplifier including a first input selectively coupled to the first node and a second input coupled to an output of the amplifier, wherein the output of the amplifier is a reference voltage, and
a third capacitor including a first terminal coupled to the output of the amplifier and a second terminal coupled to a first supply voltage; and
sense amplifier circuitry configured to use the reference voltage to read data stored in the array of memory cells.

2. The semiconductor device of claim 1 further comprising:
a first switch having a first current electrode coupled to the first node and a second current electrode coupled to the first input to the amplifier;
a second switch having a first current electrode coupled to the output of the amplifier and a second current electrode coupled to the first terminal of the third capacitor; and
a third switch having a first current electrode coupled between the first terminal of the third capacitor and the second current electrode of the second switch, and a second current electrode coupled between the first input to the amplifier and the second current electrode of the first switch, wherein the reference voltage is tapped between the output of the amplifier and the first current electrode of the second switch.

3. The semiconductor device of claim 2 further comprising:
a fifth switch having a first current electrode coupled to the first bit line and a second current electrode coupled to the first terminal of the first capacitor;
a sixth switch having a first current electrode coupled to the second bit line and a second current electrode coupled to the second terminal of the second capacitor.

4. The semiconductor device of claim 3 further comprising:
a seventh switch having a first current electrode coupled to the first terminal of the first capacitor and a second current electrode coupled to the first supply voltage;
an eighth switch having a first current electrode coupled to the first node and a second current electrode coupled to the first supply voltage;
a ninth switch having a first current electrode coupled to the second terminal of the second capacitor and a second current electrode coupled to the first supply voltage.

5. The semiconductor device of claim 4 wherein:
the first, second, fifth and sixth switches are NMOS transistors that include a control electrode coupled to a first clock signal,
the third switch is an NMOS transistor that includes a control electrode coupled to a complement of the first clock signal, and
the seventh, eighth, and ninth switches are NMOS transistors that include a control electrode coupled to a complement of a second clock signal.

6. The semiconductor device of claim 1 wherein:
each of the first set of reference memory cells includes a first resistive memory element, a second resistive memory element, a first access transistor, and a second access transistor,
the first resistive memory element includes a first terminal coupled to the first bit line, and a second terminal coupled to a first current electrode of the first access transistor,
the first access transistor includes a second current electrode selectively coupled to a respective current source during a first program mode and to a first source line when not in the first program mode, and a control electrode coupled to a first word line,
the second resistive memory element includes a first terminal coupled to the first bit line, and a second terminal coupled to a first current electrode of the second access transistor, and
the second access transistor includes a second current electrode selectively coupled to the respective current source during the first program mode and to the first source line when not in the first program mode, and a control electrode coupled to a second word line.

7. The semiconductor device of claim 6 wherein:
each of the second set of reference memory cells includes a first resistive memory element, a second resistive memory element, a first access transistor, and a second access transistor, wherein
the first resistive memory element includes a first terminal selectively coupled to a respective current source during a second program mode and the second bit line when not in the second program mode, and a second terminal coupled to a first current electrode of the first access transistor,
the first access transistor includes a second current electrode coupled to a second source line, and a control electrode coupled to a second supply voltage,
the second resistive memory element includes a first terminal selectively coupled to a respective current source during the second program mode and the second bit line when not in the second program mode, and a second terminal coupled to a first current electrode of the second access transistor, and
the second access transistor includes a second current electrode coupled to the second source line, and a control electrode coupled to the second supply voltage.

8. The semiconductor device of claim 7 wherein:
the first set of reference memory cells are programmed to store a first data value during the second program mode; and
the second set of reference memory cells are programmed to store a second data value during the first program mode, wherein the first data value is different than the second data value.

9. The semiconductor device of claim 1 further comprising:
control circuitry configured to:
couple the first bit line to the first supply voltage during the first programming mode, and float the first bit line when not in the first programming mode.

10. The semiconductor device of claim 7 further comprising:
control circuitry configured to:
float the first and second word lines in the second programming mode and couple the first and second word lines to a second supply voltage when not in the second programming mode.

11. A method of generating a reference voltage for a memory device with an array of resistive non-volatile memory (RNVM) cells, comprising:
in a reference voltage generation circuit including a first set of reference memory cells coupled to a first bit line and a second set of reference memory cells coupled to a second bit line:
charging a first capacitor having a first terminal coupled to the first bit line to a first voltage level,
charging a second capacitor to a second voltage level that is different than the first voltage level, the second capacitor having a first terminal coupled to the second terminal of the first capacitor at a first node and a second terminal coupled to the second bit line, and charge sharing between the first and second capacitors to provide a reference voltage, wherein the reference voltage is between the first and second voltage levels; and using the reference voltage to read data stored in the array of RNVM memory cells.

12. The method of claim 11 further comprising:
before charging the first and second capacitors,
programming the first set of reference memory cells to store data "0", and
programming the second set of reference memory cells to store data "1".

13. The method of claim 12, further comprising charging a third capacitor to the reference voltage through a unity gain amplifier.

14. A memory device comprising:
an array of resistive non-volatile (RNVM) memory cells;
sense amplifier circuitry coupled to the array of RNVM memory cells;
a reference voltage generator circuit coupled to supply a reference voltage to the sense amplifier circuitry, the reference voltage generator circuit including:
a first set of reference memory cells programmed to store data "0",
a second set of reference memory cells programmed to store data "1",
a first bit line coupled to the first set of reference memory cells and to a first terminal of a first capacitor,
a second bit line coupled to the second set of reference memory cells and to a first terminal of a second capacitor, wherein a second terminal of the first capacitor is coupled to a second terminal of the second capacitor at a first node,
an amplifier including a first input coupled to the first node and a second input coupled to an output of the amplifier, wherein the reference voltage is provided at the output of the amplifier, and
a third capacitor including a first terminal coupled to the output of the amplifier and a second terminal coupled to a first supply voltage.

15. The memory device of claim 14, further comprising:
a first switch configured to couple the first terminal of the first capacitor to the first bit line when a first clock signal is in a first state and to decouple the first capacitor from the first bit line when the first clock signal is in a second state;

a second switch configured to couple the first terminal of the second capacitor to the second bit line when a first clock signal is in a first state and to decouple the second capacitor from the second bit line when the first clock signal is in a second state.

16. The memory device of claim 15 further comprising:
a third switch configured to selectively couple and decouple the first node to the first input to the amplifier;
a fourth switch configured to selectively couple and decouple the output of the amplifier to the first terminal of the third capacitor; and
a fifth switch configured to selectively couple and decouple the first terminal of the third capacitor to the first input of the amplifier.

17. The memory device of claim 16 further comprising:
a sixth switch configured to selectively couple the first terminal of the first capacitor to the first supply voltage;
a seventh switch configured to selectively couple the first node to the first supply voltage;
an eighth switch configured to selectively couple to the first terminal of the second capacitor to the first supply voltage.

18. The memory device of claim 17 wherein:
the first, second, third and fourth switches are NMOS transistors that include a control electrode coupled to a first clock signal;
the fifth switch is an NMOS transistor that includes a control electrode coupled to a complement of the first clock signal;
the sixth, seventh, and eighth switches are NMOS transistors that include a control electrode coupled to a complement of a second clock signal.

19. The memory device of claim 18 further comprising:
control circuitry configured to:
de-assert the first clock signal during a pre-charge mode and assert the first clock signal outside the pre-charge mode, and
assert the second clock signal during an evaluate mode and de-assert the second clock signal outside the evaluate mode.

20. The memory device of claim 15 further comprising:
each of the first set of reference memory cells includes a first resistive memory element, a second resistive memory element, a first access transistor, and a second access transistor; and
each of the second set of reference memory cells includes a first resistive memory element, a second resistive memory element, a first access transistor, and a second access transistor.

* * * * *